(12) United States Patent
Horak et al.

(10) Patent No.: US 6,436,814 B1
(45) Date of Patent: Aug. 20, 2002

(54) INTERCONNECTION STRUCTURE AND METHOD FOR FABRICATING SAME

(75) Inventors: David V. Horak, Essex Junction; William A. Klaasen; Thomas L. McDevitt, both of Underhill; Mark P. Murray, Burlington; Anthony K. Stamper, Williston, all of VT (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 09/718,010

(22) Filed: Nov. 21, 2000

(51) Int. Cl.⁷ .................. H01L 21/4763; H01L 21/44
(52) U.S. Cl. ............ 438/637; 438/618; 438/639; 438/687
(58) Field of Search .................. 438/637, 638, 438/639, 640, 687, 618, 629, 646, 648

(56) References Cited

U.S. PATENT DOCUMENTS

| | | | |
|---|---|---|---|
| 4,720,908 A | * | 1/1988 | Wills .................. 438/643 |
| 5,098,856 A | * | 3/1992 | Beyer et al. .......... 438/422 |
| 5,116,463 A | * | 5/1992 | Lin et al. .............. 216/18 |
| 5,434,451 A | | 7/1995 | Dalal et al. |
| 5,691,573 A | | 11/1997 | Avanzino et al. |
| 5,714,418 A | * | 2/1998 | Bai et al. .............. 438/627 |
| 5,814,558 A | | 9/1998 | Jeng et al. |
| 5,889,328 A | | 3/1999 | Joshi et al. |
| 5,933,753 A | | 8/1999 | Simon et al. |
| 5,943,599 A | | 8/1999 | Yao et al. |
| 5,955,786 A | | 9/1999 | Avanzino et al. |
| 5,981,382 A | | 11/1999 | Konecni et al. |
| 5,985,751 A | * | 11/1999 | Koyama ............. 438/637 |
| 6,040,243 A | * | 3/2000 | Li et al. .............. 438/687 |
| 6,046,104 A | | 4/2000 | Kepler |
| 6,114,243 A | * | 9/2000 | Gupta et al. .......... 438/687 |
| 6,174,782 B1 | * | 1/2001 | Lee .................. 438/396 |
| 6,191,025 B1 | * | 2/2001 | Liu et al. ............. 438/622 |
| 6,211,085 B1 | * | 4/2001 | Liu .................. 438/687 |
| 6,235,629 B1 | * | 5/2001 | Takenaka ............ 438/638 |
| 6,342,446 B1 | * | 1/2002 | Smith et al. .......... 438/687 |
| 6,350,662 B1 | * | 2/2002 | Thei et al. ........... 438/435 |

FOREIGN PATENT DOCUMENTS

| | | | |
|---|---|---|---|
| JP | 406085052 A | * | 3/1994 |
| JP | 406163528 A | * | 6/1994 |

* cited by examiner

Primary Examiner—Matthew Smith
Assistant Examiner—Chuong A Luu
(74) Attorney, Agent, or Firm—Schmeiser, Olsen & Watts; H. Jerry Walter, Jr.

(57) ABSTRACT

An interconnection structure preferably including one or more conductors that have a central region filled with an insulator, and a method of fabricating such an interconnection structure for preferably making an electrical connection to the conductor(s). The method preferably includes the steps of depositing and patterning a first insulator over a substrate to form an aperture opening to the substrate; depositing and polishing a first conductor to leave the first conductor in the aperture; depositing and patterning a second insulator to form an opening through the second insulator and a recess in the aperture; depositing one or more second conductors to line the opening and the recess, and to form a central region of the interconnection structure; depositing a third insulator to at least partially fill the central region; and making an electrical connection to the second conductor(s).

17 Claims, 12 Drawing Sheets

INTERCONNECTION STRUCTURE AND METHOD FOR FABRICATING SAME

BACKGROUND OF THE INVENTION

1. Technical Field

This invention generally relates to semiconductor interconnects, and more specifically relates to an interconnection structure and method for fabricating same.

2. Background Art

A semiconductor wafer may contain an array of devices whose contacts are interconnected by patterns of metal wires. In order to take full advantage of the device and circuit density on a given wafer, it is usually necessary to make interconnections among the various devices and circuit elements in the wafer. However, due to the level of integration of devices and circuits on a wafer, interconnections can no longer be made by means of a single level network of metal lines. Often, it is necessary to form two or more such levels of metal lines which are vertically spaced apart and separated by intermediate insulators.

Electrical connections are made between the different levels of metal lines by means of interconnection structures. In its simplest form and using well known photolithographic techniques, an interconnection structure may be formed by first masking an insulator with photoresist, and then etching through a portion of the insulator to form an opening to the underlying metal layer. Once the openings are etched through the insulators separating the levels, they are filled with metal to form interconnect structures. These multiple levels of interconnection patterns of metal wires, with the individual layers connected by interconnect structures, operate to distribute signals among the circuits on the wafer.

Many semi-conductor manufacturers employ similar interconnect schemes. One of the more common implementations is to employ a vertical tungsten stud connection as a contact to the silicon device level and to form a local interconnect or "MC". Subsequently, a second vertical tungsten stud connection is formed to provide electrical connection from the local interconnect to the first wiring level or metal-1. The metal-1 structure may be fabricated from copper, in order to minimize resistance and maximize device performance. Copper interconnects are most often deposited by electroplating from a liquid solution.

There can be problems with the interconnection structures described above. One such problem is created when the vertical tungsten stud structures contain porosity, often in the form of voids, seams, or cavities. These seam or voids are formed because the aspect-ratio of the feature (the ratio of depth to width) is such that the CVD tungsten deposition technique does not have sufficient conformality to fully fill these features. Often, these seams can be aggravated by wet etching or cleaning processes that are used to clean the top surface of the stud after the subsequent interconnect is patterned. The purpose of these cleaning steps is to remove contaminant materials and prepare the top surface of these tungsten stud connections so that the next level of metallization may be formed on top of the stud.

When liquid and/or gaseous contaminants are deposited into these features, they can be entrapped by the deposition of metal layers through CVD (chemical vapor deposition), PVD (physical vapor deposition), electroplating, or the like. These entrapped contaminants may subsequently cause corrosive attack, or may volatilize in high temperature operations and cause catastrophic delamination of the structure.

Accordingly, what is needed is an interconnection structure and method for fabricating same that overcomes the formation of voids during conductor fill of high aspect ratio interconnect structures and the subsequent electroplating problems that disrupt interconnection structures and electrical connections.

DISCLOSURE OF THE INVENTION

The preferred embodiment of the present invention provides an interconnection structure preferably including one or more conductors that have a central region filled with an insulator, and a method of fabricating such an interconnection structure for preferably making an electrical connection to the conductor(s). The method preferably includes the steps of depositing and patterning a first insulator over a substrate to form an aperture opening to the substrate; depositing and polishing a first conductor to leave the first conductor in the aperture; depositing and patterning a second insulator to form an opening through the second insulator and a recess in the aperture; depositing one or more second conductors to line the opening and the recess, and to form a central region of the interconnection structure; depositing a third insulator to at least partially fill the central region; and making an electrical connection to the second conductor(s).

One advantage of the present invention is that voids or cavities in the form of open seams in the conductor layers are not formed or worsened, even with high aspect ratio structures. Preferably, a highly conformal insulator is deposited over the conductor(s). The highly conformal insulator centrally fills the interconnection structure. The highly conformal insulator is capable of filling high aspect ratio structures, recursive structures, and the like, especially with a subsequent reflow treatment after deposition of the highly conformal insulator. Moreover, the highly conformal insulator does not form the undesirable voids or cavities. There are no metal CVD or PVD depositions that are as conformal as these insulator depositions.

Another advantage of the present invention is that electroplating problems are eliminated when copper wiring is used to make the electrical connection. Specifically, because voids or cavities are avoided, the plating solution is not trapped. Therefore, when the copper is plated and during a subsequent elevated temperature anneal, no plating solution is entrapped.

Still another advantage of the present invention is that preferred interconnection structure including a central insulator filled region still maintains adequate surface area to form a viable electrical connection. Adequate electrical connection surface area preferably is maintained through conductor protrusions into an upper interconnection level. Alternatively, adequate electrical connection surface area can be maintained through an upper interconnection level protrusion to the lower conductor(s).

The foregoing and other features and advantages of the present invention will be apparent from the following more particular description of the preferred embodiment of the invention and methods for fabricating the same, as illustrated in the accompanying drawings.

BEST MODE(S) FOR CARRYING OUT THE INVENTION

In general and referring to FIGS. 1–12, the preferred embodiment of the present invention provides a method 100 for forming an interconnection structure that preferably includes depositing insulator 220 and patterning insulator 220 to form aperture 221 opening to substrate 210; depositing conductor 230 and polishing conductor 230, thereby leaving conductor 230 in aperture 221; depositing insulator 310 and patterning insulator 310, the patterning of insulator 310 forming opening 340 through insulator 310 and causing an etching into conductor 230 of aperture 221, thereby forming recess 330 in aperture 221; depositing at least one conductor 501, thereby lining opening 340 through insulator 310 and recess 330 in aperture 221, and thereby forming central region 530 of the interconnection structure; depositing third insulator 610, thereby at least partially filling central region 530 of the interconnection structure; and making an electrical connection to at least one conductor 501.

One advantage of following preferred method 100 is that voids or cavities in the form of open seams in the conductor layers are not formed or worsened, even with high aspect ratio structures. Over conductor 501 and filling central region 530 of the interconnection structure, preferably a highly conformal insulator 610 is deposited. Highly conformal insulator 610 is capable of filling high aspect ratio structures, recursive structures, and the like, especially with a subsequent reflow treatment, yet does not form the undesirable voids or cavities. There are no metal CVD or PVD depositions that are as conformal as a highly conformal insulator 610 deposition.

Another advantage of following method 100 is that electroplating problems are eliminated when copper wiring is used to make the electrical connection. Specifically, because voids or cavities are avoided, the plating solution is not entrapped. Therefore, when the copper is plated and during a subsequent elevated temperature anneal, the interconnection structures and electrical connections are not disrupted.

Figure 7:
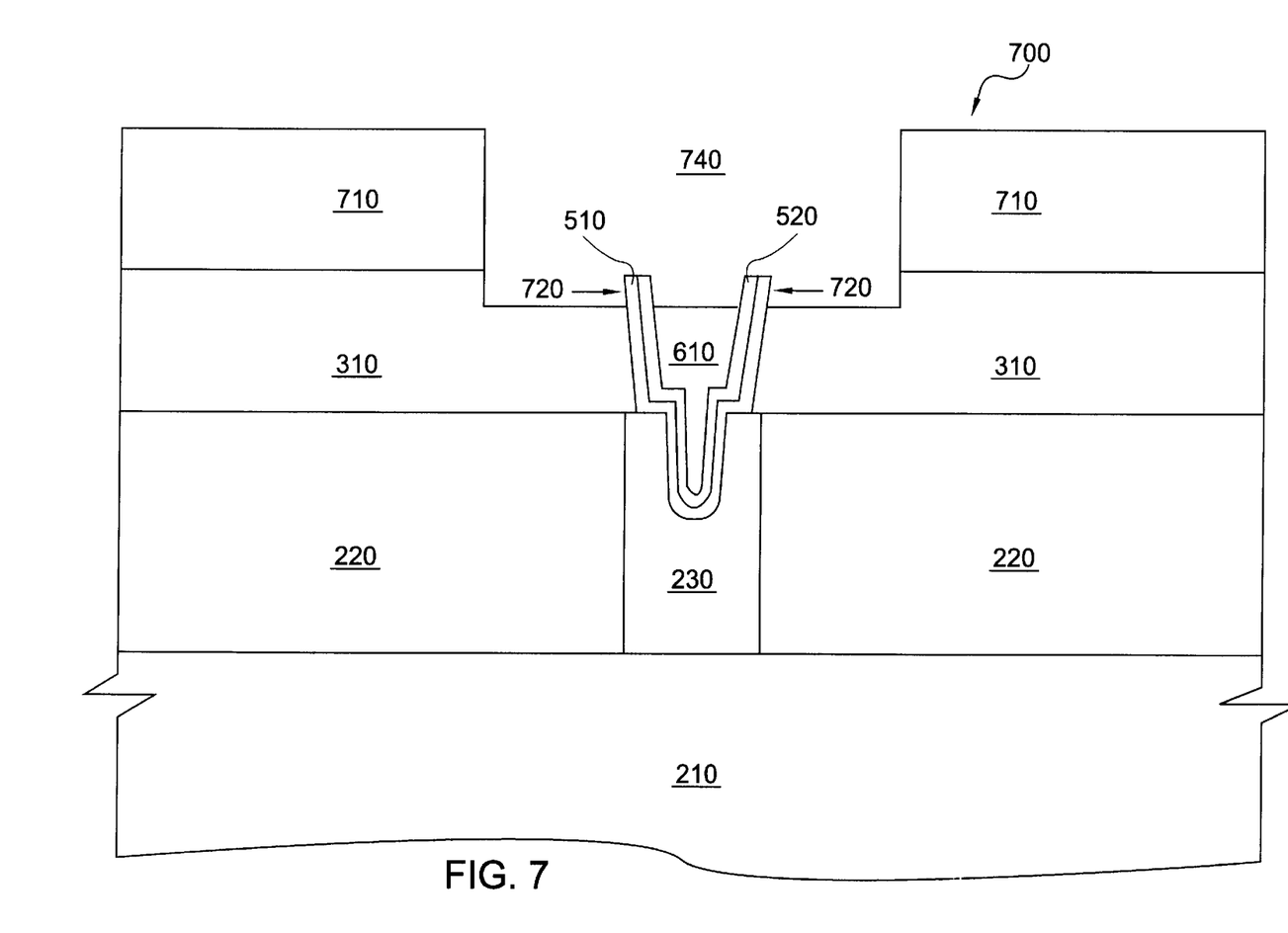
FIG. 7 is a cross-sectional view of a wafer portion intermediate in the method in FIG. 1.
Figure 8:
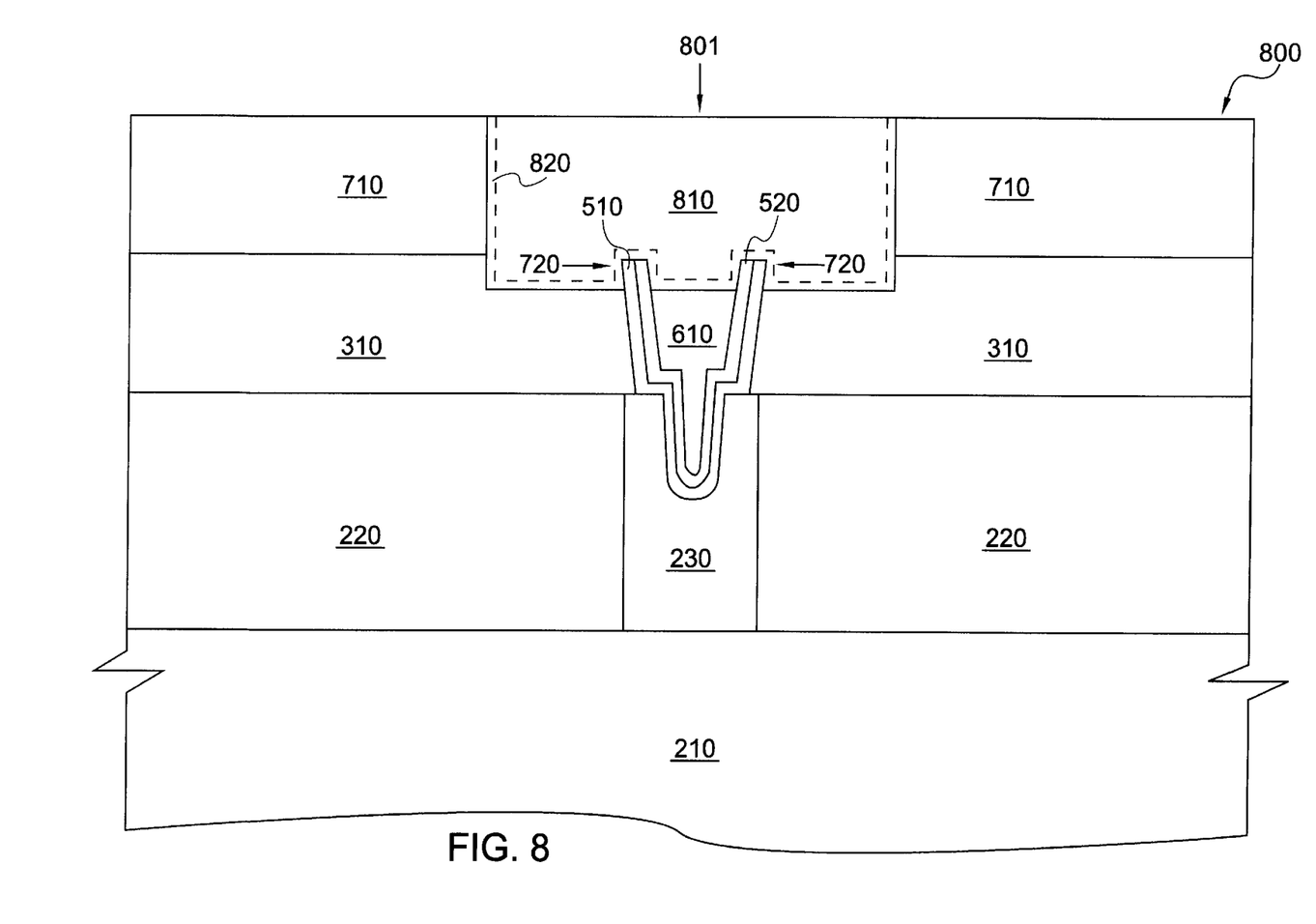
FIG. 8 is a cross-sectional view of a wafer portion that can result from the method in FIG. 1.
Figure 11:
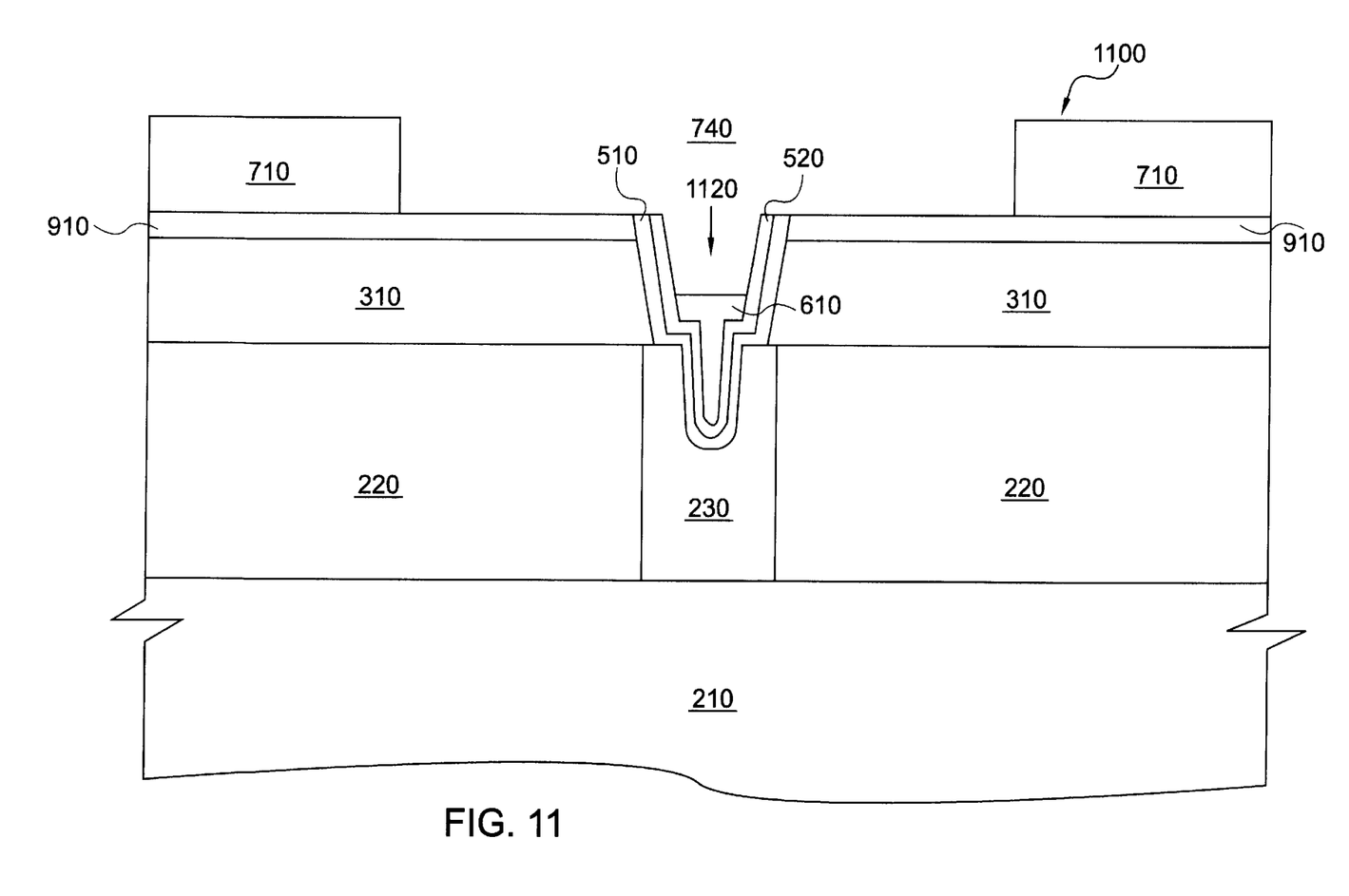
FIG. 11 is a cross-sectional view of another wafer portion intermediate in the method in FIG. 1.
Figure 12:
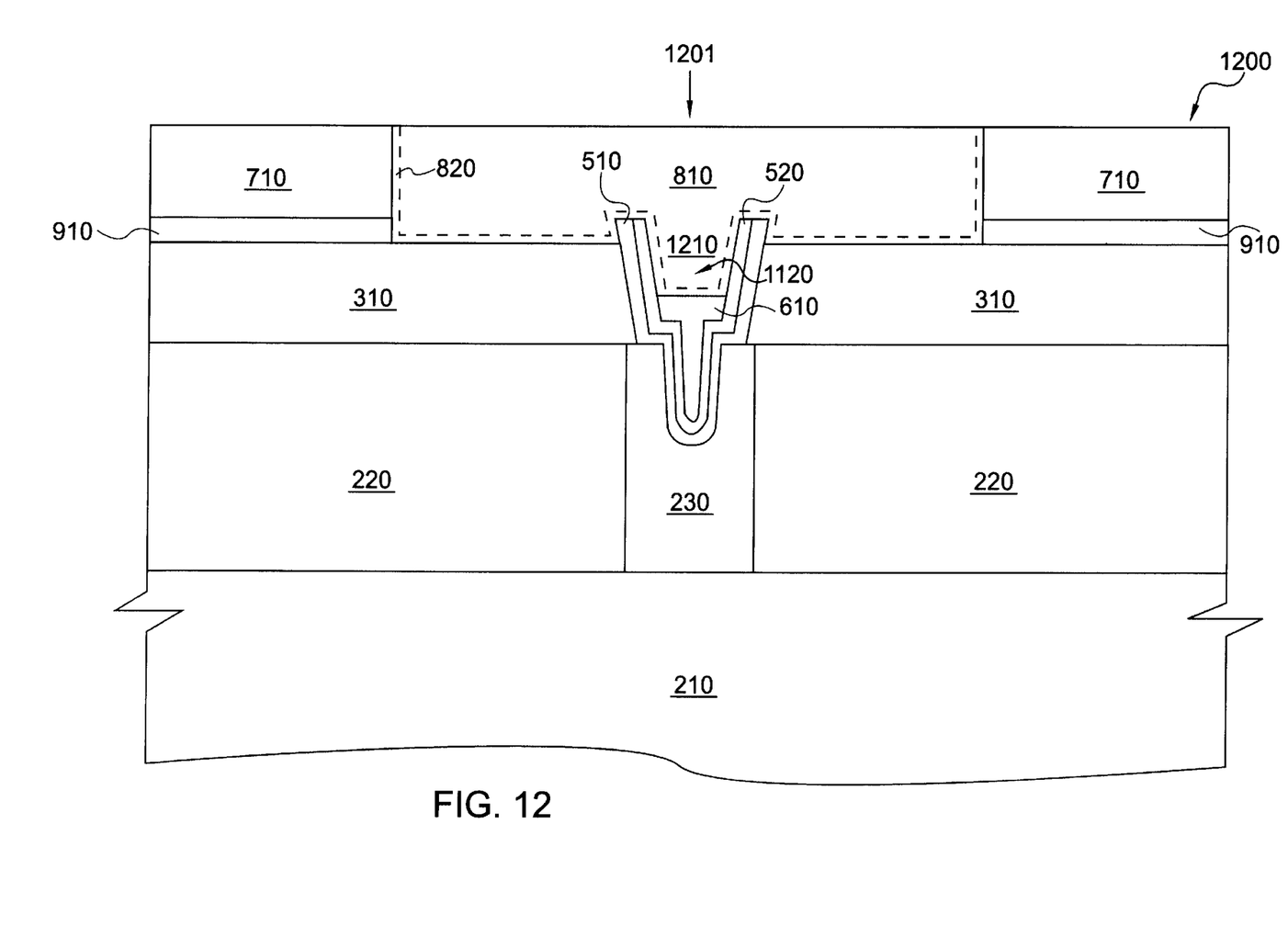
FIG. 12 is a cross-sectional view of another wafer portion that can result from the method in FIG. 1.

Still another advantage of following method 100 is that the interconnection structure with central insulator filled region 530 still maintains adequate surface area to form a viable electrical connection. Adequate electrical connection surface area preferably can be maintained, as discussed in greater detail hereinafter, through preferred interconnection structure 801 that includes protrusion 720 of conductor 501 that extends into at least one conductor 810 (as seen in FIGS. 7–8). Alternatively, adequate electrical connection surface area can be maintained, as discussed in greater detail hereinafter, through interconnection structure 1201 that includes protrusion 1210 of at least one conductor 810 that extends into lower hollow 1110 in central region 530 of the interconnection structure (as seen in FIGS. 11–12).

Figure 1:
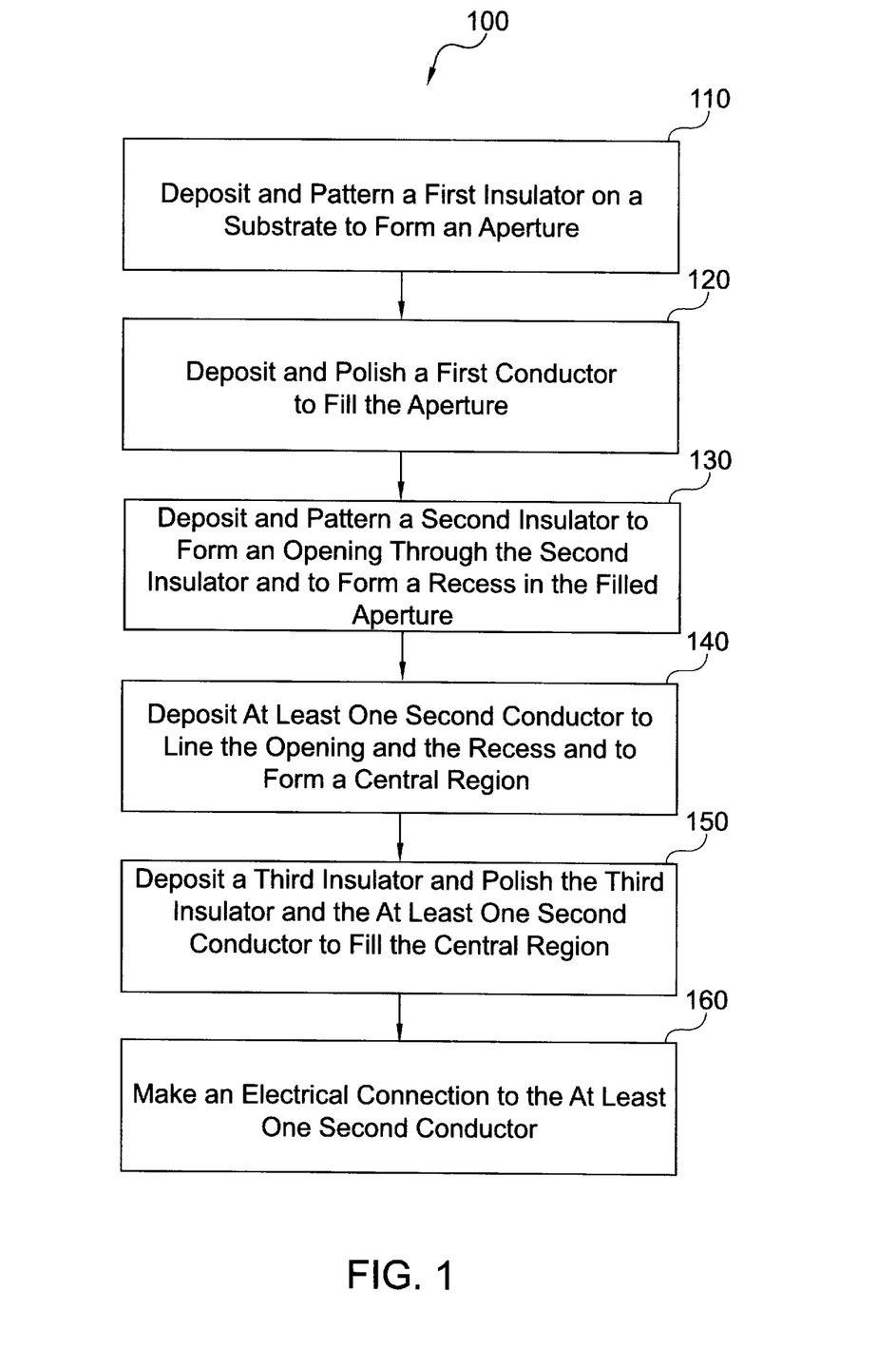
FIG. 1 is a flow diagram showing a method for forming an interconnection structure according to a preferred embodiment of the present invention.
Figure 2:
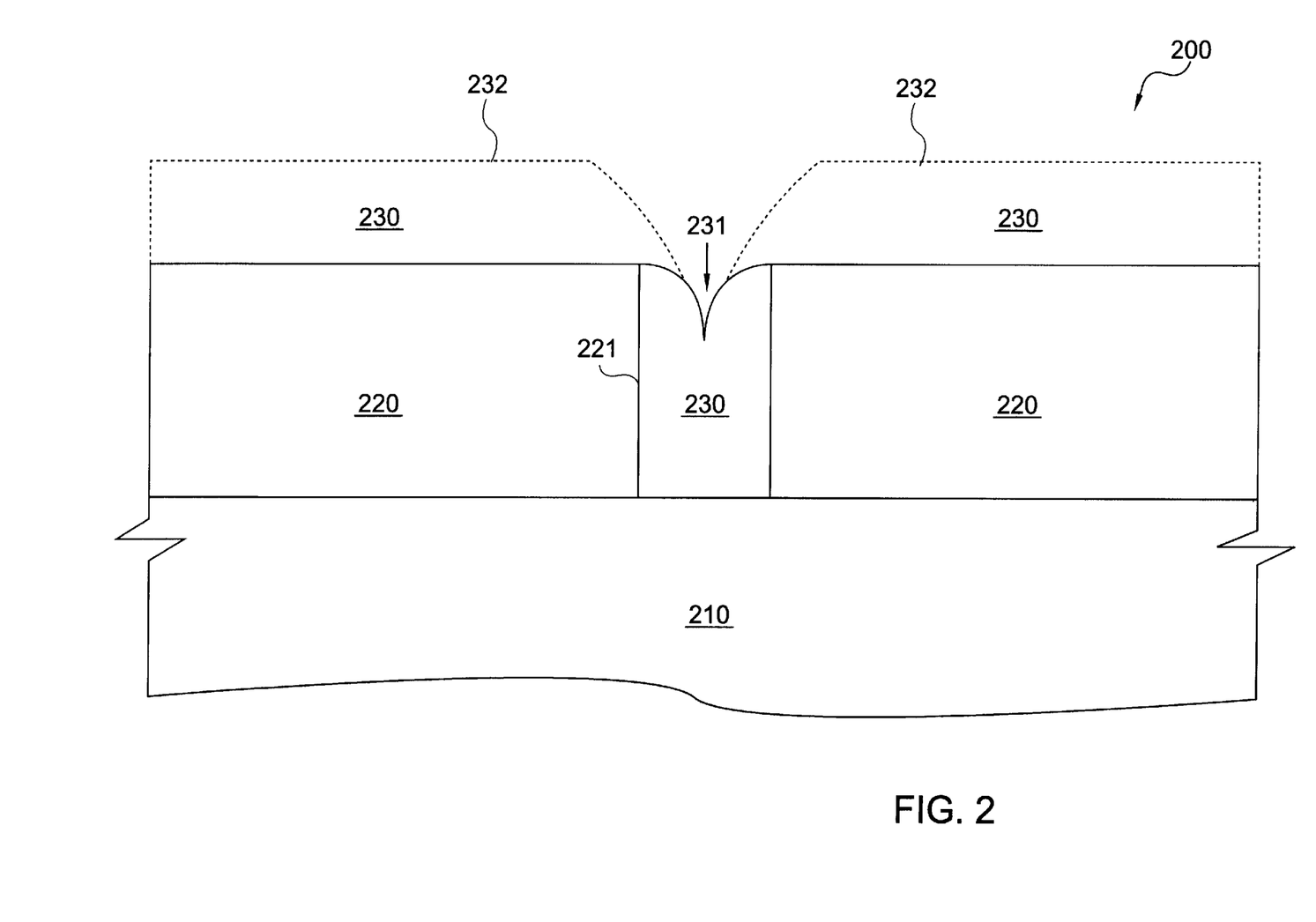
FIG. 2 is a cross-sectional view of a wafer portion intermediate in the method in FIG. 1.

Referring to semiconductor wafer portion 200 of FIG. 2 and describing method 100 of FIG. 1 in greater detail, in step 110, insulator 220 is preferably deposited by any mechanisms known in the art on substrate 210. Insulator 220 is also preferably patterned to form aperture 221. Such patterning could include photoresist patterning, etching of insulator 220, etc. as is known in the art, and aperture 221 depicted in wafer portion 200 of FIG. 2 could be a via, hole, trench, line, or the like. For example, substrate 210 could be passivated and a long trench could be etched all the way down to substrate 210 through insulator 220. Preferably aperture 221 opens to active devices of substrate 210. Such active devices could be front end of line (FEOL) devices, such as transistors for example.

In step 120 and in reference to FIG. 2, conductor 230 is preferably deposited by any mechanisms known in the art on wafer portion 200. Generally, conductor 230 is tungsten, but could be other materials known in the art, such as the materials capable of being conductor 501, or conformal conductor liner 510 and conformal conductor 520 as hereinafter described. Conductor 230 is also preferably polished or planarized by any mechanisms known in the art. For example, conductor 230 can be polished down to insulator 220 with chemical mechanical polish (CMP) so that conductor 230 from the field areas (as shown by dashed lines 232) is removed. Polishing leaves conductor 230 in aperture 221. Insulator 220 and aperture 221 can define a local interconnect level, or MC level that is directly over substrate 210. Aperture 221 preferably makes contact with some portions of the active devices of substrate 210. Additionally, aperture 221 includes high aspect ratio features 231, such as voids (cavities) in the form of open seams in first conductor 230 in aperture 221, that cannot be avoided and are nonplanar due to incomplete conductor 230 fill, as seen in FIG. 2.

Figure 3:
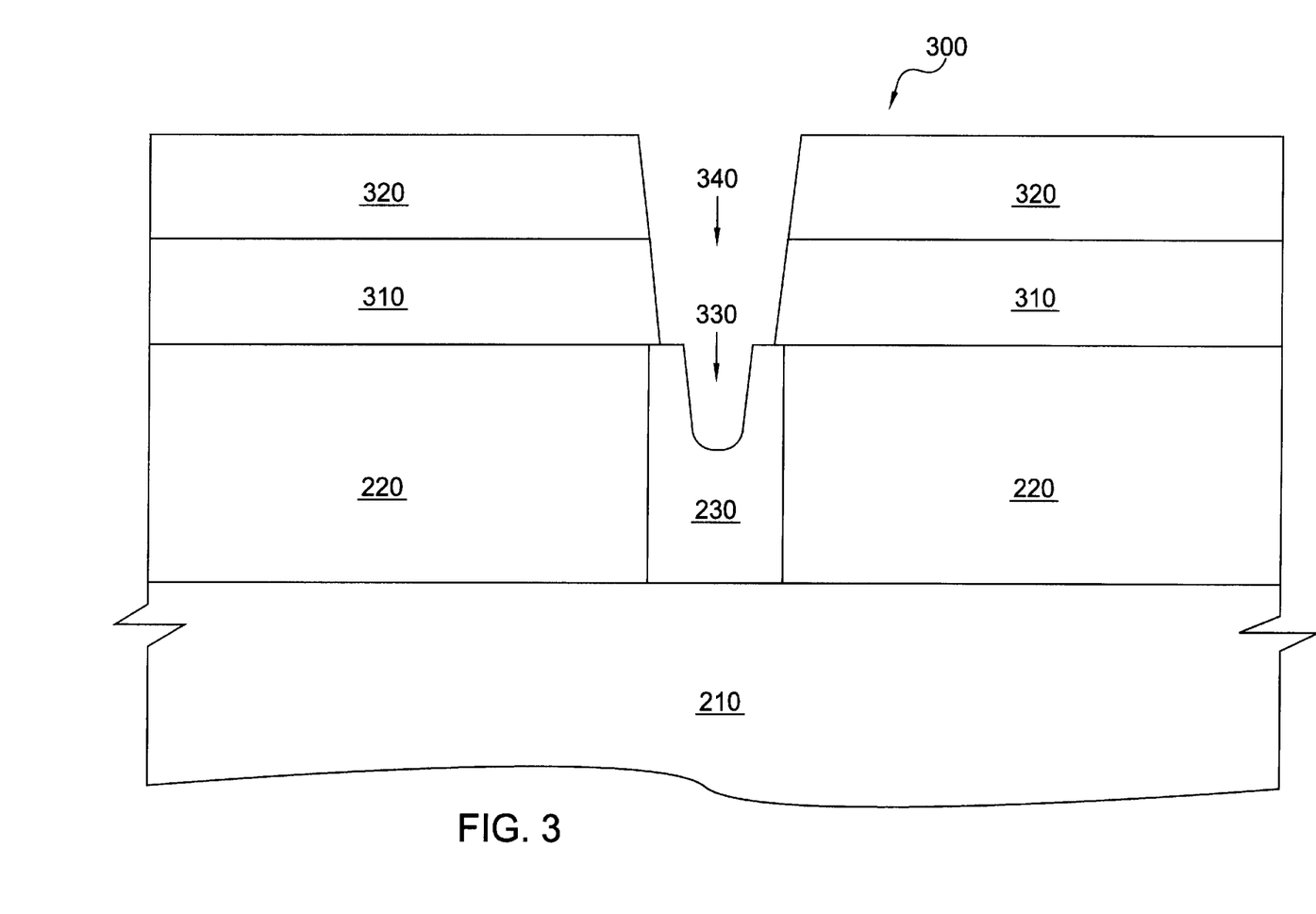
FIG. 3 is a cross-sectional view of a wafer portion intermediate in the method in FIG. 1.
Figure 4:
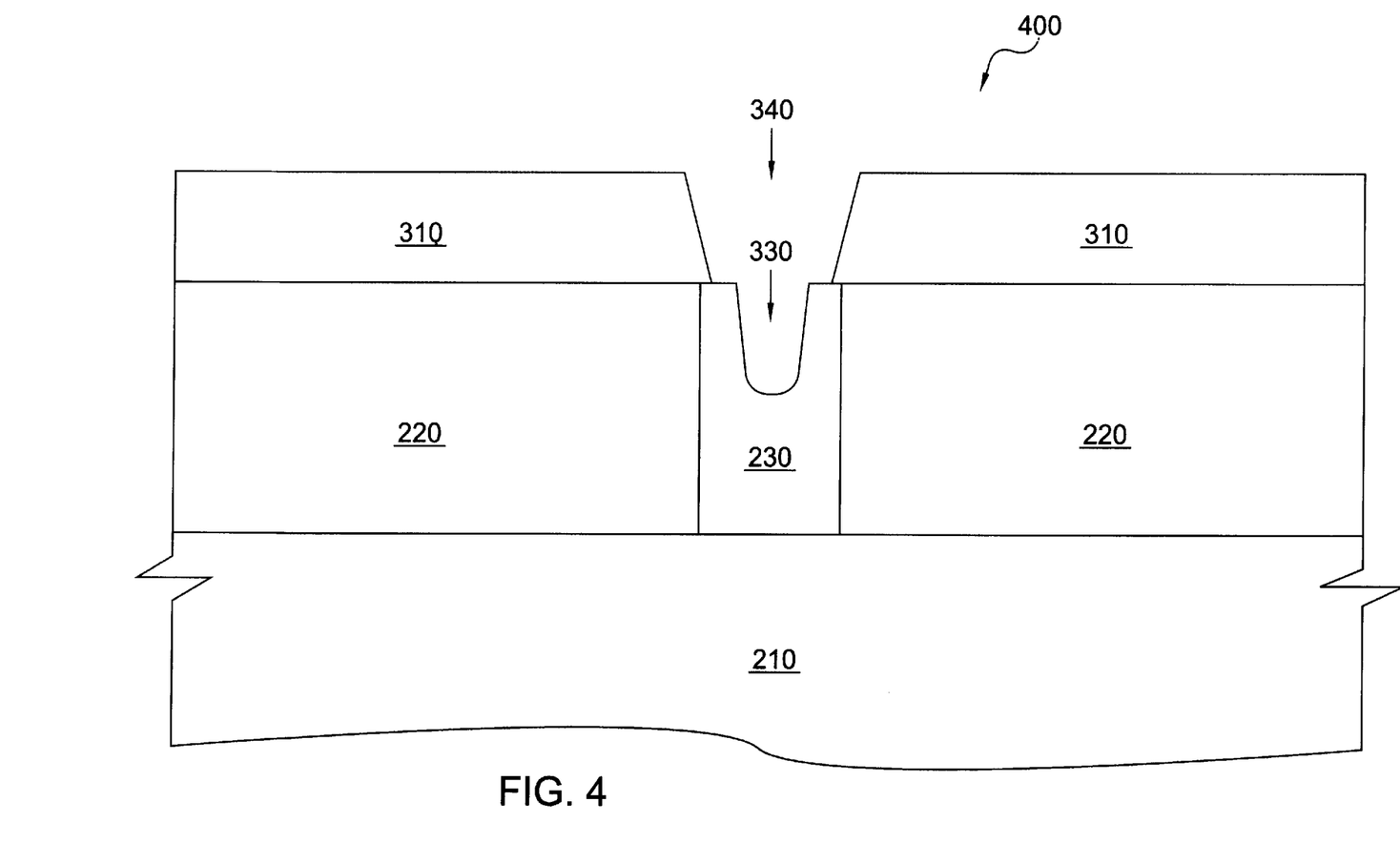
FIG. 4 is a cross-sectional view of a wafer portion intermediate in the method in FIG. 1.

In step 130 and referring to semiconductor wafer portions 300 and 400 of FIGS. 3–4 respectively, insulator 310 is deposited by any mechanisms known in the art. Insulator 310 could define a CA level. Insulator 310 is preferably patterned as well, which could include photoresist patterning, etching of insulator 310, etc. as is known in the art. For example, photoresist 320 can be applied over insulator 310 and patterned, as shown in FIG. 3. Patterning of insulator 310 preferably causes an etching into insulator 310, thereby forming opening 340 through insulator 310 and causing an etching into conductor 230 of aperture 221, thereby preferably forming recess 330 in aperture 221. As depicted in FIG. 4, photoresist 320 is removed, leaving wafer portion 400. Recess 330 can be formed from high aspect ratio feature 231 (see FIG.2) in aperture 221. For example, patterning insulator 310 could include a non-selective fluorocarbon type etch down through insulator 310, thereby forming opening 340 through insulator 310. Then, a wet clean, such as hydrofluoric acid, solvent cleans with surfactants, or the like, can be performed to clean out residual insulator 310, thereby attacking, opening up, and enlarging nonplanar high aspect ratio feature 231 of aperture 221, and thereby forming recess 330 in aperture 221.

Figure 5:
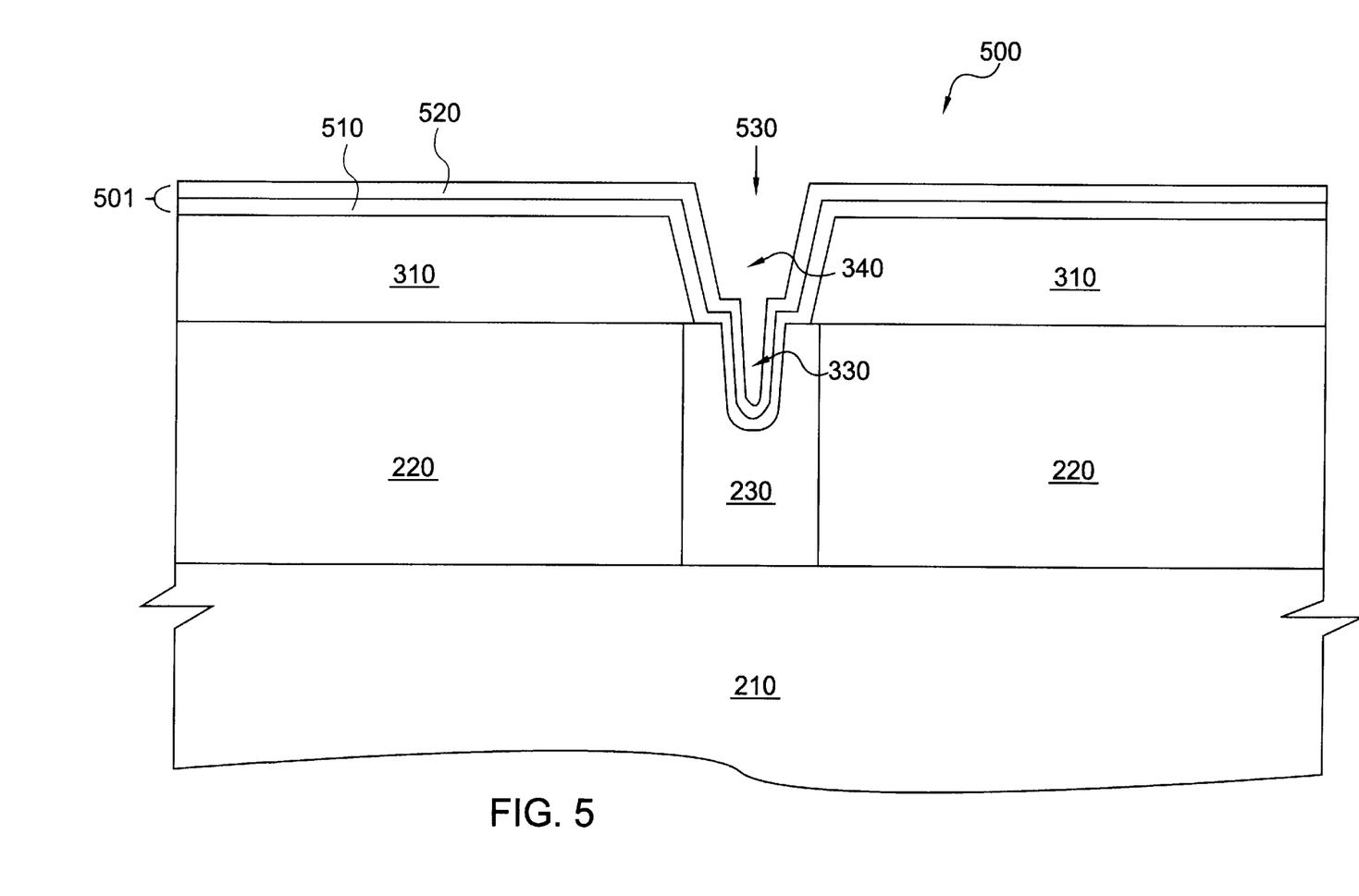
FIG. 5 is a cross-sectional view of a wafer portion intermediate in the method in FIG. 1.
Figure 9:
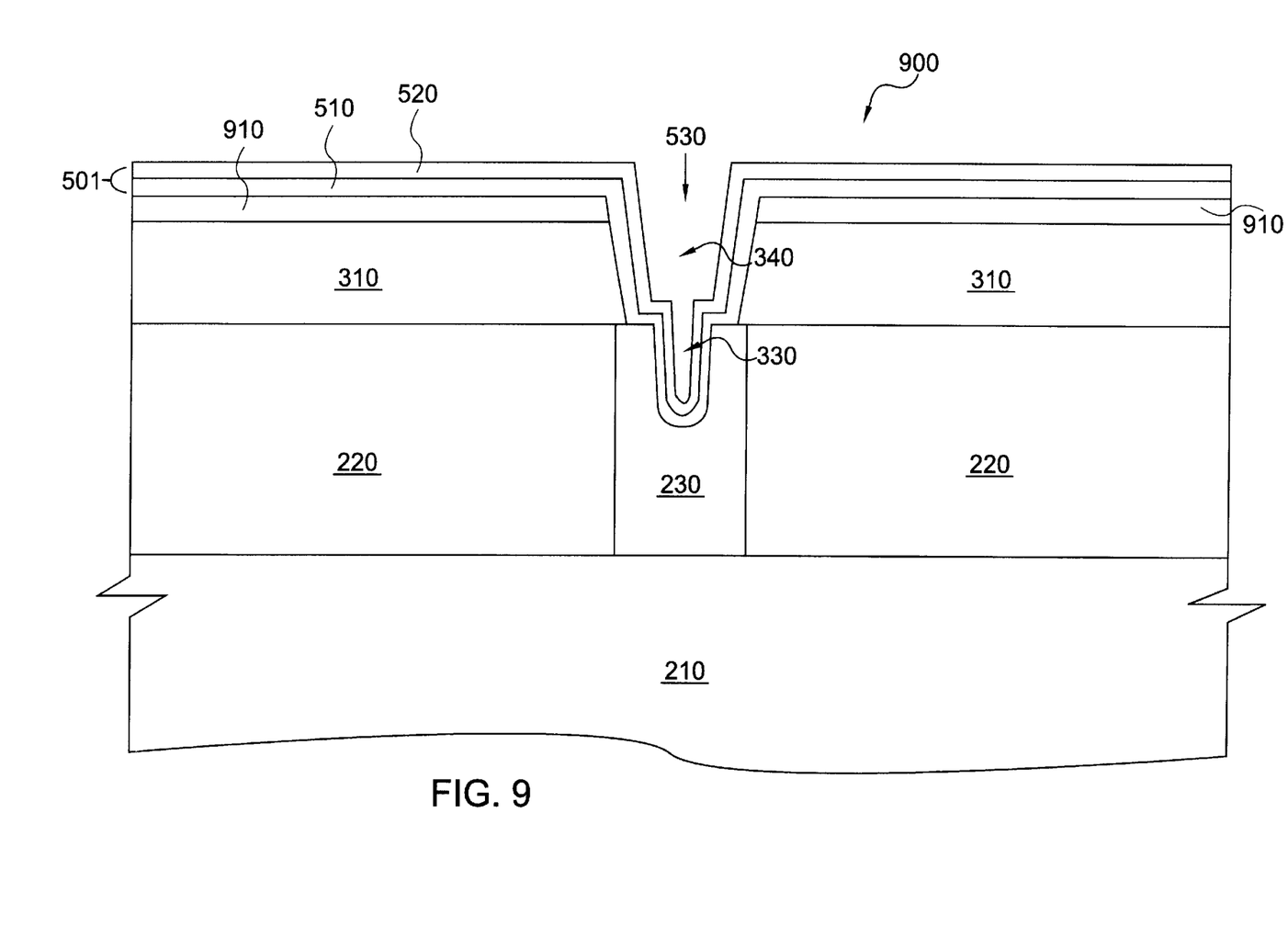
FIG. 9 is a cross-sectional view of another wafer portion intermediate in the method in FIG. 1.

In step 140 and referring to wafer portions 500 and 900 of FIGS. 5 and 9 respectively, at least one conductor 501 is deposited by any mechanisms known in the art. For example, conductor 501 can be deposited by physical vapor deposition (PVD), ionized physical vapor deposition (IPVD), chemical vapor deposition (CVD), or the like. As also seen in FIG. 5, conductor 501 partially fills opening 340 through insulator 310 and recess 330 in aperture 221 by lining opening 340 and recess 330. Thus, conductor 501 preferably forms a thin shell-like liner. Preferably, conductor 501 in opening 340 defines a substantially vertical, truncated, annularly conical shell-like liner (as depicted in FIGS. 5–12). Notwithstanding, conductor 501 in opening 340 could define a substantially vertical, annularly cylindrical shell-like liner.

Conductor 501 acts as a protective barrier lining the side walls of opening 340 and recess 330, and promotes adhesion to and prevents structural delamination of second insulator 310. Furthermore, conductor 501 forms and defines central region 530 of the interconnection structure. Central region 530 is any open region resulting from partially filling opening 340 and recess 330. Materials capable of being conductor 501 include tantalum, tantalum nitride, tungsten, tungsten nitride, titanium, titanium nitride, titanium tungsten, chromium, niobium, copper, aluminum, cobalt, copper alloy, aluminum alloy, or cobalt alloy.

The thickness of conductor 501 depends on opening 340 size. Preferably, the ratio of the thickness of conductor 501 lining opening 340 to the diameter of opening 340 is approximately 0.25:1, thereby still leaving central region 530. For example, if opening 340 had a 0.2 Micron diameter, conductor 501 thicknesses preferably would be approximately 500 Angstroms. As another example, if opening 340 had a 0.5 Micron diameter, conductor 501 thicknesses preferably would be approximately 1500 Angstroms.

Additionally and shown in FIGS. 5 and 9, conductor 501 could include conformal conductor liner 510 and conformal conductor 520. Conformal conductor liner 510 would be the protective barrier lining the sidewalls of opening 340 and recess 330, and would be between conformal conductor 520 and insulator 310. For example, if conformal conductor 520 was CVD tungsten, conformal conductor liner 510 would prohibit the very aggressive oxidizing chemistry of CVD tungsten from affecting insulator 310 or any other underlying materials. Additionally, because conformal conductor liner 510 and conformal conductor 520 are preferably conformal conductive materials, they are easily capable of filling high aspect ratio structures, recursive structures, and the like. Thus, materials capable of being conformal conductor liner 510 and conformal conductor 520 include tantalum nitride/tantalum, tantalum/tantalum nitride, tantalum/copper, tantalum nitride/copper, tungsten nitride/tungsten, tungsten/tungsten nitride, titanium nitride/titanium, and titanium/titanium nitride.

Figure 6:
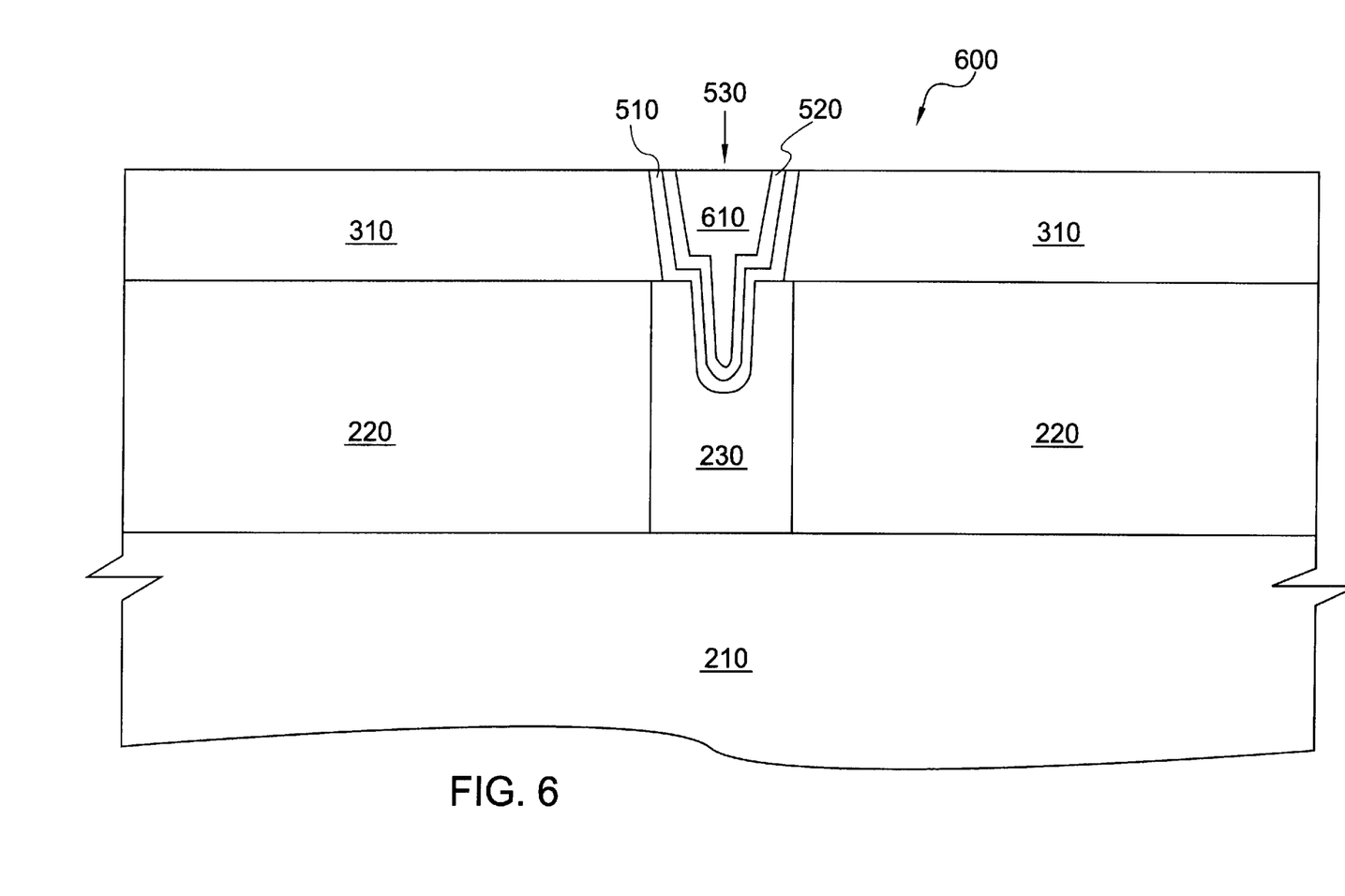
FIG. 6 is a cross-sectional view of a wafer portion intermediate in the method in FIG. 1.
Figure 10:
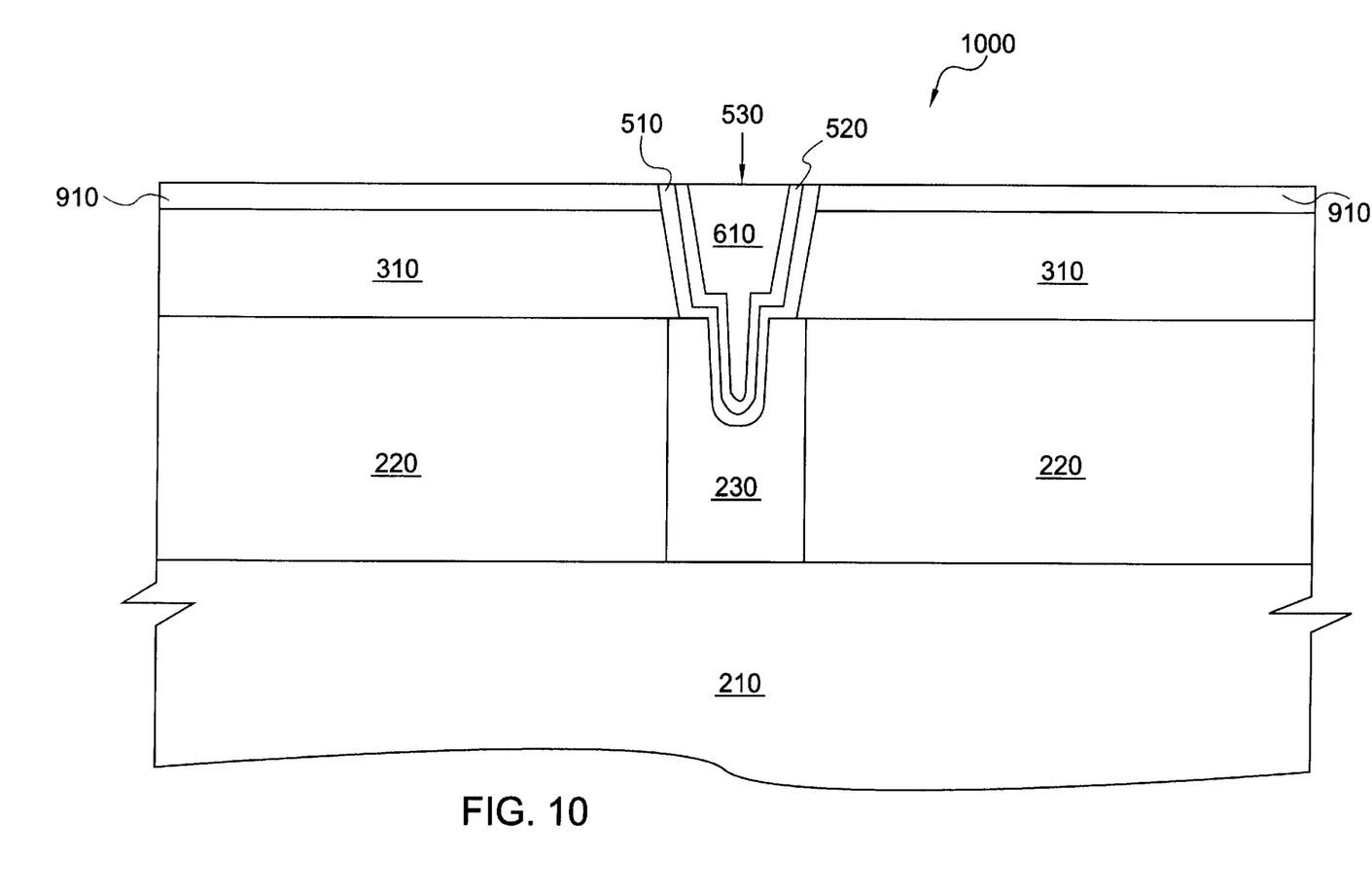
FIG. 10 is a cross-sectional view of another wafer portion intermediate in the method in FIG. 1.

In step 150 and referring to wafer portions 600 and 1000 of FIGS. 6 and 10 respectively, insulator 610 is deposited by any mechanisms known in the art. Preferably, insulator 610 is highly conformal, such that when insulator 610 is deposited, it is easily capable of at least partially filling high aspect ratio structures, recursive structures, and the like. Referring to FIGS. 6 and 10, insulator 310 is deposited over conductor 501 and at least partially fills central region 530 of the interconnection structure. Furthermore, insulator 610 can fill central region 530. Additionally, a reflowing or densifying of insulator 610 can be performed. Reflowing or densifying of insulator 610 could be performed below atmospheric pressure, but still at approximately several hundred torr. Materials capable of being insulator 610 include spin on glass (SOG) or oxide, or sub-atmospheric CVD, plasma enhanced CVD, thermal CVD, high density plasma enhanced CVD, and the like depositions of oxide or other insulative materials. Insulator 610 and conductor 501 can also be polished by any mechanisms known in the art. For example, insulator 610 and conductor 501 can be polished down to insulator 310 with chemical mechanical polish (CMP).

In step 160, an electrical connection is made to conductor 501. Any electrical connections known in the art are contemplated in the present invention. Nevertheless, preferred interconnection structure 801 (as seen in FIGS. 7–8) and alternate interconnection structure 1201 (as seen in FIGS. 11–12) are two examples illustrating an electrical connection to conductor 501.

Preferred interconnection structure 801, which comprises protrusion 720 of conductor 501 that extends into at least one conductor 810, will hereinafter be described in reference to FIGS. 7–8. As depicted in wafer portion 700 of FIG. 7, preferably insulator 710 is deposited by any mechanisms known in the art. Insulator 710 is preferably patterned as well, which could include photoresist patterning, etching of insulator 710, etc. as is known in the art. For example, opening 740 can be etched through insulator 710. The etch preferably can continue into insulator 310 to remove a portion of insulator 310, thereby forming protrusion 720 of conductor 501. Such an etching can be a reactive ion etch with a fluorocarbon type etch chemistry, like carbon tetraflouride (CF4), that does not etch or volatilize conductor 501, thereby leaving protrusion 720.

As depicted in wafer portion 800 of FIG. 8, preferably at least one conductor 810 is deposited by any mechanisms known in the art. Conductor 810 fills opening 740 and the removed portion of third insulator 310, thereby contacting protrusion 720 of at least one second conductor 501 and forming the electrical connection. Conductor 810, along with insulator 710, can define a metal 1 level, or M1 level. Additionally, conductor 810 can include conformal conductor liner 820 and conformal conductor 810. Conformal conductor liner 820 preferably can act as a protective barrier, like conformal conductor liner 510 preferably does.

Materials capable of being conductor 810, conformal conductor liner 820, and conformal conductor 810 can be the conductive materials previously described in conjunction with at least one second conductor 501, conformal conductor liner 510, and conformal conductor 520. Notwithstanding, the present invention preferably integrates electroplating in the back end of line (BEOL). For example, conformal conductor 810 could include a copper seed layer and copper. Such a conformal conductor liner 820 and copper seed layer combination would prevent diffusion of copper ions through insulators 310 and 710. Also, such a conformal conductor liner 820 and copper seed layer combination would conduct the electroplating current over the surface of wafer portion 800. Furthermore, a deposition of a copper seed layer prior to the electroplating of copper would provide an environment that is more conducive to electroplating. Moreover, a copper seed layer would facilitate the formation of a single crystalline copper structure because the seed layer is structurally similar to the electroplated copper. Thus, through electroplating, copper can form over the copper seed layer and fill opening 740 and the removed portion of insulator 310, thereby contacting conductor protrusion 720 and forming the electrical connection. Conductor 810 is preferably polished as well by any mechanisms known in the art, such as CMP, down to insulator 710, thereby leaving opening 740 and the removed portion of insulator 310 filled.

Alternate interconnection structure 1201, which comprises protrusion 1210 of conductor 810 that extends into lower hollow 1110 in central region 530 of the interconnection structure, will hereinafter be described in reference FIGS. 11–12, in addition to steps 130–150 and FIGS. 3, 9, and 10. As part of step 130, preferably etch stop layer 910, as depicted in wafer portion 900 of FIG. 9, is deposited by any mechanisms known in the art over insulator 310 in FIG. 3. Etch stop 910 is preferably a thin film of silicon nitride ($Si_3N_4$), or can be any other etch stop material known in the art, such as SiC or $Al_2O_3$. Etch stop 910 and insulator 310 are preferably patterned as well, which could include photoresist patterning, etching of etch stop 910 and insulator 310, etc. as is known in the art. For example, photoresist 320 can be applied over etch stop 910. Patterning of etch stop 910 and insulator 310 preferably causes an etching into etch stop 910 and insulator 310, thereby forming opening 340 through etch stop 910 and insulator 310. Patterning also causes an etching into conductor 230 of aperture 221, thereby preferably forming recess 330 in aperture 221. Steps 140 and 150, as depicted in wafer portions 900 and 1000 of FIGS. 900–1000 respectively, are as previously described, except for the following. In step 150 and in reference to FIG. 10, insulator 610 and conductor 501 are polished by any mechanisms known in the art down to etch stop 910.

As depicted in wafer portion 1100 of FIG. 11, preferably insulator 710 is deposited by any mechanisms known in the art. Insulator 710 is preferably patterned as well, which could include photoresist patterning, etching of insulator 710, etc. as is known in the art. For example, opening 740 can be etched through insulator 710 stopping on etch stop 910. The etch preferably can selectively continue into insulator 610 of central region 530 to remove a portion of insulator 610, thereby forming hollow 1110 in central region 530 that exposes a portion of conductor 501. Such selective etching can be an RIE oxide etch. RIE oxide etches are polymerizing fluorocarbon chemistries, such as $CHF_3$, $CH_3F$, $C_4F_8/CHF_3$, and the like. Furthermore, etch stop 910 exposed by opening 740 can be removed or cleared by etching (such as with $CF_4O_2$, $CF_4$, and the like), thereby allowing opening 740 to extend to insulator 310, as depicted in FIG. 12.

As depicted in wafer portion 1200 of FIG. 12, preferably conductor 810 is deposited by any mechanisms known in the art. Conductor 810 fills opening 740 and hollow 1110, thereby forming protrusion 1210 of conductor 810, and thereby contacting conductor 501 and forming the electrical connection. Conductor 810 can include conformal conductor liner 820 and conformal conductor 810, and, as previously described, the present invention preferably integrates electroplating in the back end of line (BEOL). Thus, through electroplating, copper can form over the copper seed layer and fill opening 740 and hollow 1110, thereby forming protrusion 1210 of conductor 810, and thereby contacting conductor 501 and forming the electrical connection. Conductor 810 is preferably polished as well by any mechanisms known in the art, such as CMP, down to insulator 710, thereby leaving opening 740 and hollow 1110 filled.

Thus, method 100 essentially is a novel, specialized method for forming interconnection structures. Method 100 avoids the formation of voids or cavities during metal fill of high aspect ratio interconnection structures. Additionally, because method 100 avoids the formation of voids, electroplating solution is not entrapped. Therefore, during a subsequent elevated temperature anneal, the interconnection structures and electrical connections are not disrupted.

Given the numerous options that are possible within method 100 of FIG. 1, there are multiple interconnection structures that may be produced. FIGS. 2–12 present only possible interconnection structures that may result from method 100 and other interconnection structures are conceivable that are within the scope of the present invention according to method 100. The examples below set forth specific process conditions for performing various steps of method 100 and, thus, each is presented as a more preferred embodiment of method 100.

EXAMPLE 1

This embodiment is an interconnection structure with a lower conformal conductor protrusion into an upper conductor. Specifically, a semiconductor substrate having active front end of line (FEOL) devices and local interconnect level thereon is provided. The local interconnect level is formed of a local interconnect insulator and a local interconnect conductor, namely W, and includes a high aspect ratio feature that is nonplanar due to incomplete conductor fill. A CA insulator is then deposited on the local interconnect level, followed by photopatterning to define an opening on the CA insulator. Next, the CA opening is etched through the CA insulator, followed by extending the etch partially into the local interconnect conductor, thereby enlarging and opening the nonplanar high aspect ratio feature.

After the photopattern is removed, a conformal conductor liner, namely Ti/TiN, is deposited, followed by a deposition of a conformal conductor, namely W. Then, a highly conformal insulator, namely SOG, is deposited, followed by a densifying or reflowing of the SOG. Next, the SOG, conformal conductor, and conformal conductive liner are polished down to the CA insulator.

An M1 insulator is then deposited, followed by photopatterning to define an M1 opening on the M1 insulator. The M1 opening is then etched through the M1 insulator, followed by extending the etch partially into the CA insulator to form a conformal conductor protrusion. After the photopattern is removed, a liner is deposited, namely TaN, followed by a deposition of a Cu seed layer. Finally, Cu is electroplated, and then the liner and Cu are polished down to the M1 insulator.

EXAMPLE 2

This embodiment is an interconnection structure with an upper conductor protrusion down to a lower conformal conductor. Specifically, a semiconductor substrate having active front end of line (FEOL) devices and local interconnect level thereon is provided. The local interconnect level is formed of a local interconnect insulator and a local interconnect conductor, namely W, and includes a high aspect ratio feature that is nonplanar due to incomplete conductor fill. A CA insulator is then deposited on the local interconnect level, followed by a deposition a $Si_3N_4$ thin film on the CA insulator. Then a CA opening in the $Si_3N_4$ film and CA insulator is defined by photopatterning. Next, the CA opening is etched through the $Si_3N_4$ film and CA insulator, followed by extending the etch partially into the local interconnect conductor, thereby enlarging and opening the nonplanar high aspect ratio feature.

After the photopattern is removed, a conformal conductor liner, namely Ti/TiN, is deposited, followed by a deposition of a conformal conductor, namely W. Then, a highly conformal insulator, namely SOG, is deposited, followed by a densifying or reflowing of the SOG. Next, the SOG, conformal conductor, and conformal conductive liner are polished down to the $Si_3N_4$ thin film.

An M1 insulator is then deposited, followed by photopatterning to define an M1 opening on the M1 insulator. The M1 opening is then etched through the M1 insulator stopping on the $Si_3N_4$ thin film, followed by selectively etching only into the SOG. After the photopattern is removed, and optionally the exposed $Si_3N_4$ thin film, a liner is deposited, namely TaN, followed by a deposition of a Cu seed layer. Finally, Cu is electroplated, and then the liner and Cu are polished down to the M1 insulator.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Similarly, unless otherwise specified, any sequence of steps of the method indicated in the drawings or herein are given as an example of a possible sequence and not as a limitation. Many modifications and variations are possible in light of the above teaching without departing from the spirit and scope of the forthcoming claims.

What is claimed is:

1. A method of forming an interconnection structure, the method comprising the steps of:
   depositing and patterning a first insulator to form an aperture opening to a substrate;
   depositing a first conductor and polishing the first conductor, thereby leaving the first conductor in the aperture;
   depositing a second insulator and patterning the second insulator, the step of patterning the second insulator forming an opening through the second insulator and etching into the first conductor of the aperture, thereby forming a recess in the aperture;
   depositing at least one second conductor, thereby lining the opening through the second insulator and the recess in the aperture, and thereby forming a central region of the interconnection structure;
   depositing a third insulator, thereby at least partially filling the central region of the interconnection structure; and
   making an electrical connection to the at least one second conductor.

2. The method of claim 1 further comprising the step of polishing the third insulator and the at least one second conductor to the second insulator.

3. The method of claim 2 further comprising the step of depositing an etch stop layer over the second insulator, wherein the step of patterning the second insulator comprises the steps of etching into the etch stop layer and the second insulator, thereby forming an opening through the etch stop layer and the second insulator; etching into the first conductor of the aperture, thereby forming a recess in the aperture, and wherein the step of polishing the third insulator and the at least one second conductor to the second insulator comprises the step of polishing the third insulator and the at least one second conductor to the etch stop layer.

4. The method of claim 3, wherein the step of making an electrical connection to the at least one second conductor comprises the steps of:
   depositing a fourth insulator;
   patterning the fourth insulator;
   selectively etching an opening through the fourth insulator stopping on the etch stop layer;
   etching into the third insulator of the central region to remove a portion of the third insulator, thereby forming a hollow in the central region that exposes a portion of the at least one second conductor; and
   depositing the at least one third conductor and polishing the at least one third conductor to the fourth insulator, thereby forming a protrusion of the at least one third conductor, and thereby filling the hollow in the central region.

5. The method of claim 4, wherein the at least one third conductor comprises a conformal conductor liner and a conformal conductor.

6. The method of claim 5, wherein the conformal conductor comprises a copper seed layer and copper.

7. The method of claim 4, wherein the step of etching an opening through the fourth insulator removes the etch stop layer.

8. The method of claim 1, wherein the at least one second conductor comprises tantalum, tantalum nitride, tungsten, tungsten nitride, titanium, titanium nitride, titanium tungsten, chromium, niobium, copper, aluminum, cobalt, copper alloy, aluminum alloy, or cobalt alloy.

9. The method of claim 1, wherein the at least one second conductor comprises a first conformal conductor liner and a first conformal conductor.

10. The method of claim 9, wherein said first conformal conductor liner and said first conformal conductor respectively comprise tantalum nitride/tantalum, tantalum/tantalum nitride, tantalum/copper, tantalum nitride/copper, tungsten nitride/tungsten, tungsten/tungsten nitride, titanium nitride/titanium, and titanium/titanium nitride.

11. The method of claim 1, wherein said opening has a predetermined diameter and the ratio of the thickness of said at least one second conductor lining the opening to said diameter of the opening is approximately 0.25:1.

12. The method of claim 1, wherein the third insulator comprises spin on glass or oxide deposited by sub-atmospheric chemical vapor deposition, plasma enhanced chemical vapor deposition, thermal chemical vapor deposition, or high density plasma enhanced chemical vapor deposition.

13. The method of claim 12, wherein the method further comprises the step of reflowing the third insulator.

14. The method of claim 1, wherein the step of patterning the second insulator comprises the step of causing a non-selective fluorocarbon type etch down through the second insulator, thereby forming an opening through the second insulator, and the step of performing a wet clean, thereby opening up nonplanar high aspect ratio features of the first conductor of the aperture and forming a recess in the aperture.

15. The method of claim 1, wherein the step of making an electrical connection to the at least one second conductor comprises the steps of:
   depositing a fourth insulator;
   patterning the fourth insulator;
   etching an opening through the fourth insulator;
   etching into the third insulator to remove a portion of the third insulator, thereby forming a protrusion of the at least one second conductor; and
   depositing at least one third conductor and polishing the at least one third conductor to the fourth insulator, thereby filling the removed portion of the third insulator.

16. The method of claim 15, wherein the at least one third conductor comprises a conformal conductor liner and a conformal conductor.

17. The method of claim 15, wherein the conformal conductor comprises a copper seed layer and copper.

* * * * *